Nov. 18, 1958 W. F. LOOTENS 2,861,226

HIGH CURRENT RECTIFIER

Filed March 22, 1956

INVENTOR:
WILLIAM F. LOOTENS,

BY Julius J. Zaskalicky
HIS ATTORNEY.

United States Patent Office 2,861,226

Patented Nov. 18, 1958

2,861,226

HIGH CURRENT RECTIFIER

William F. Lootens, Syracuse, N. Y., assignor to General Electric Company, a corporation of New York Application March 22, 1956, Serial No. 573,258

3 Claims. (Cl. 317—234)

Figure 1:
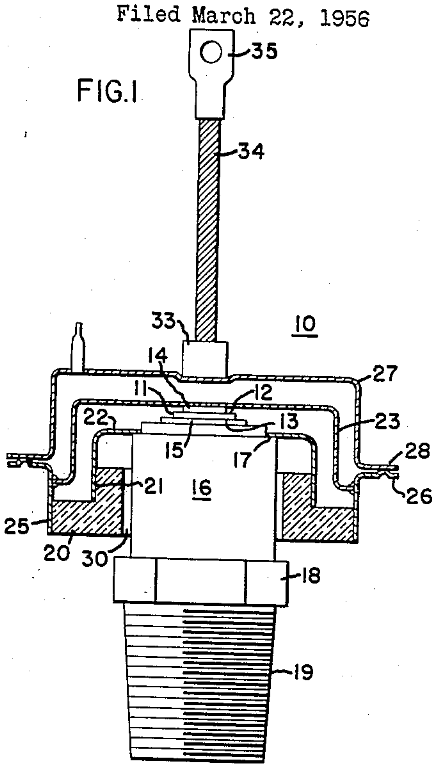

This invention relates to asymmetrically conductive devices such as rectifiers and, more particularly, to semiconductor junction-type rectifiers having large current carrying capacities.

As will readily be appreciated by those skilled in the art, the electrical properties of semiconductor rectifiers of the junction barrier type are subject to variation due to the heat generated therein. This variation presents a severe problem when the semiconductor rectifier must handle large amounts of current, for example, on the order of 50 amperes with a peak inverse voltage rating of around 300 volts. The heat to be dissipated under these conditions would be on the order of 50 watts in the forward or easy direction of current flow and on the order of 3 to 5 watts in the back or difficult direction of current flow. In addition to the removal of heat from the semiconductor junction, the device must be resiliently mounted to withstand external pressure, shock, vibration, and sudden changes in temperature. The device must also be free of and protected from atmospheric contamination. The present invention is designed to overcome these difficulties.

Accordingly, it is an object of this invention to provide a new and improved high current semiconductor rectifying device.

A further object of this invention is to provide a rectifier of the semiconductor junction type with means for efficient removal of heat from the semiconductor junction.

A further object of this invention is to provide a new and improved high current semiconductor junction rectifier unit which is sealed, and mounted such that the semiconductor junction is protected from mechanical and moisture damage, and the amount of external pressure on the semiconductor junction device is minimized.

A still further object of this invention is to provide a new and improved asymmetrically conductive device of the semiconductor junction type which mounts and encloses the device within a casing for promoting heat transfer from the semiconductor junction during operation.

In carrying out this invention in one form thereof, an asymmetrically conducting device is provided comprising a body of semiconductor material including a region of P-type conductivity and a region of N-type conductivity meeting in a P–N junction. One region of the asymmetrically conductive device is mounted on a conductive stud which forms one terminal of the device. A casing which forms the other electrical terminal of the device is conductively connected by resilient means to the other region of the asymmetrically conducting device. Means are further provided for mounting the stud in electrically insulating relationship to the casing. The resulting structure is simple yet provides a device which is capable of handling large currents with a high inverse voltage rating.

These and other advantages of this invention will be more clearly understood from the following description taken in connection with the accompanying drawings, and its scope will be apparent from the appended claims.

Figure 2:
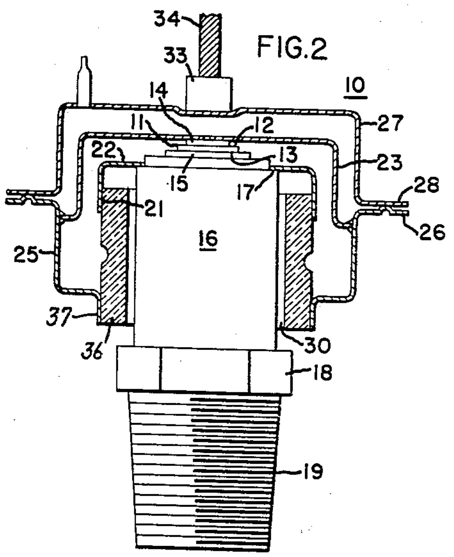

In the drawings,

Figure 1 is an elevational view, in section of a high current semiconductor rectifier constructed in accordance with this invention; and Figure 2 is an elevational view, in section, of another embodiment of this invention.

Referring now to Figure 1, a semiconductor junction-type rectifier is shown mounted in a sealed, self-contained unit which is referred to generally by the reference character 10. In this embodiment, the semiconductor rectifier consists of a monocrystalline pellet 11 of strong N-type silicon in which has been formed a P–N junction by alloying and diffusion of an acceptor impurity, such as aluminum, in the side 12 of the pellet. Silicon is preferably used due to its characteristics which include better operation at high temperatures. However, other semiconductive materials such as germanium may be used. Also, other junction rectifiers may be used. The other side 13 of the pellet 11 has a coating of gold or other suitable material to provide an ohmic connection thereto. As will appear obvious to those skilled in the art, sides 12 and 13 may be interchanged to change the polarity of device 10. Plate 14 is mounted on one side of pellet 11 and plate 15 is mounted on the other side thereof. Plates 14 and 15 are preferably made of molybdenum, since molybdenum and silicon have similar temperature coefficients of expansion. By providing plates with similar coefficients of expansion, the silicon pellet is protected from extraneous pressures created by temperature differentials when the device is being fabricated or utilized in an operating circuit. The entire silicon diode which consists of the aforesaid elements is mounted on a copper base provided by the copper stud 16. Stud 16 is provided with an annular shelf 17 on the upper extremity thereof, a hexagonal nut 18 in the central portion thereof, and a tapered thread 19 on the lower portion thereof. The stud 16 is mounted on a ring 25, of steel or other suitable material, which forms a portion of the casing for unit 10 through the combination of an annular ceramic insulator 20 and an annular clip 22. Clip 22 is adapted to be received on the shelf 17 of stud 16 and upon the annular shelf 21 of ceramic 20. Clip 22 is characterized by having a temperature coefficient of expansion similar to that of the ceramic 20 and may be made of cold rolled steel or of a variety of iron, nickel and cobalt alloys having a coefficient of expansion comparable to that of ceramic materials such as Fernico. Ceramic 20 may be secured to steel ring 25 and to clip 22 by silver brazing to a metallized surface on the ceramic applied by the process of moly-manganese metallizing on ceramic which is well known in the art and is shown, for example, by Patent No. 2,667,432 of Nolte which is assigned to the assignee of this invention. A resilient contact clip 23 is secured to plate 14 and to ring 25.

It will be noted that the unit as described comprises a unit which may be electrically tested before sealing. After testing, the unit 10 may be sealed by securing a cup-shaped casing member 27, of steel or other suitable material, which has flanged end portions 28 thereon to the flanged end portions 26 of ring 25. A collar 33 is mounted on cup 27 and receives a flexible cable 34 having a terminal 35. Cup 27 is also provided with an exhaust tube 29 which may be used to test for leaks in the sealed unit or may be used to control the ambient conditions in the sealed area. When this is accomplished, the tube may be pinched off and sealed.

As has been previously set forth, unit 10 is designed to handle high current, and for the device to operate properly and provide good rectification for high current ratings, it is essential that heat be removed from the P–N junction. Stud 16 is provided for this very purpose. It is preferably made of copper because copper is both a good heat conductor and a good electrical conductor. Copper stud 16 is threaded on its lower extremity and is adapted to be screwed into a heat sink. Thread 19 is tapered in order to provide a tight fit with the heat sink as it is screwed therein by the hex nut 18. By the use of a tapered thread 19, better thermal contact can be made between the heat sink and stud 16 than could be made with a straight thread and a shoulder on stud 16.

In order to provide a unitary device, copper stud 16 is secured to and insulated from the casing element 25 which comprises the other electrical terminal of the rectifying device 10. An annular ring 20 of ceramic or other suitable insulating material is utilized for this purpose. A ceramic material is preferred because it is a good insulator and can withstand high temperatures while remaining strong mechanically. However, the annular ring of ceramic material 20 could not be directly secured to copper stud 16 due to the great difference of temperature coefficient expansion between copper and ceramic. The annular ring of ceramic material 20 is secured to the copper stud 16 through clip 22 which takes up any difference in the coefficients of expansion of the ring 20 and stud 16. To further reduce the stresses on the ceramic, members 22 and 25 are so formed that a section of each acts as a flexible link between the ceramic and its supports. A gap or channel 30 is left between ceramic 20 and stud 16 to provide a longer creepage path for current which extends around the outer extremities of ceramic 20 to clip 22. This path is formed by dust which gathers on the ceramic, and if a heavy concentration forms, a short circuit path for current is provided. If the ceramic 20 was directly connected to stud 16, this path would be considerably reduced, which would provide a shorter distance for current to leak from the copper stud 16 to casing 25.

In order to secure the copper stud 16 to ceramic 20 as heretofore mentioned without providing undue stress or tension on the ceramic, clip 22 which has nearly the same coefficient of expansion as ceramic 20 is utilized. Clip 22 is made long in order to take up expansion and to allow a slack at its central or joint section. This clip greatly reduced breakage of the ceramic 20 by transmitting very little pressure to the ceramic.

Since the electrical characteristics of semiconductors are subject to change by pressure, it is desirable to eliminate as far as possible subjecting silicon pellet 11 to pressure from external connections. This has already been partly eliminated by the use of molybdenum plates 14 and 15 having a similar coefficient of expansion as that of the semiconductor material. Copper strip 23 also aids in preventing external pressure from being exerted upon the silicon pellet 11 by providing an extremely resilient electrical connection thereto. Copper strip 23 is thin and light so that no stress is applied to the silicon junction.

The combination of copper strip 23, ring 25 and stud 16 which is secured to ring 25 by clip 22 and ceramic 20 between which is mounted a P–N junction comprise a complete unit which may be tested. This would allow the discarding of devices not suitable for operation under the required specifications before sealing.

In order to prevent contamination from ambient conditions, the device may then be completely sealed by the addition of cup-shaped casing member 27. The flexible cable 34 which is attached thereto eliminates all strain from thermal or mechanical shock.

The modification shown in Figure 2 provides a tubular-shaped ceramic 35 in place of the step-wise ceramic 20 shown in Figure 1. This provides a more economical type construction by eliminating the necessity of the step-wise configuration. In order to secure the tubular ceramic 36 to a portion of the casing comprised by ring 25, ring 25 is provided with a flanged end portion 37 which is secured to ceramic 36.

The high current silicon rectifier provided by this invention presents a rugged, efficient device which operates satisfactorily under adverse conditions. A sealed, self-contained unit is provided which eliminates atmospheric contamination of the semiconductor junction. The device further minimizes external and internal pressures which may be exerted upon the P–N junction to adversely affect its operating characteristics. Additionally, unit 10 is designed to remove large amounts of heat from the semiconductor junction which is an absolute necessity when operating the device at high current and high inverse voltage ratings.

Since other modifications varied to fit particular operating requirements and environments will be apparent to those skilled in the art, the invention is not considered limited to the examples chosen for purposes of disclosure and covers all changes and modifications which do not constitute departures from the true spirit and scope of this invention.

What I claim as new and desire to secure by Letters Patent of the United States is:

1. An asymmetrically conductive device comprising a semiconductor element having two surfaces separated by a rectification barrier, a conductive stud, means for conductively securing said semiconductor element at one of said two surfaces to said stud, a casing member, resilient means for conductively connecting the other of said two contact surfaces to said casing member, an annular ring of insulating material secured to said casing member and spaced from said stud, and a clip secured to said stud and to said annular ring for mounting said stud on said casing member, whereby said stud is electrically isolated from said casing member.

2. An asymmetrically conductive device comprising a semiconductor element having two contact surfaces separated by a rectification barrier, a conductive stud having an annular shelf thereon, means for conductively securing said semiconductor element at one of said two contact surfaces to said stud, a casing member, resilient means for conductively connecting the other of said two contact surfaces to said casing member, a ring of insulating material having an annular shelf thereon secured to said casing member, an annular clip having one end portion thereon secured to the annular shelf of said stud and having the other end thereon secured to the annular shelf on said ring of insulating material, and a second casing member of cup-shaped configuration secured to said first-mentioned casing member for sealing said device.

3. A high current rectification device comprising a semiconductor element having a P–N junction between two surfaces thereof, a stud having an annular shelf on one end thereof and a tapered thread on the other end thereof, means for conductively securing one surface of said semiconductor element to said one end of said stud which has the annular shelf thereon, a ring-shaped casing member, resilient means for conductively connecting the other of said surfaces of said semiconductor element to said ring-shaped casing, an annular ring of insulating material having a step-wise configuration which defines an inner shelf portion thereon secured to said casing member, an annular clip secured to the shelf on said stud and to the inner shelf on said ring of insulating material, a cup-shaped casing member having a flexible lead attached thereto, and means for securing said cup-shaped casing member to said ring-shaped casing member, whereby said semiconductor element is sealed to prevent atmospheric contamination.

References Cited in the file of this patent

UNITED STATES PATENTS

| | | |
|---|---|---|
| 2,725,505 | Webster et al. | Nov. 29, 1955 |
| 2,745,044 | Lingel | May 8, 1956 |
| 2,751,528 | Burton | June 19, 1956 |
| 2,756,374 | Colleran et al. | July 24, 1956 |
| 2,763,822 | Frola et al. | Sept. 18, 1956 |
| 2,776,920 | Dunlap | Jan. 8, 1957 |